US012028996B2

(12) United States Patent
Yahata

(10) Patent No.: US 12,028,996 B2
(45) Date of Patent: Jul. 2, 2024

(54) CIRCUIT BOX

(71) Applicant: Mitsubishi Electric Corporation, Tokyo (JP)

(72) Inventor: Naoki Yahata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 233 days.

(21) Appl. No.: 17/785,972

(22) PCT Filed: Mar. 17, 2020

(86) PCT No.: PCT/JP2020/011655
§ 371 (c)(1),
(2) Date: Jun. 16, 2022

(87) PCT Pub. No.: WO2021/186534
PCT Pub. Date: Sep. 23, 2021

(65) Prior Publication Data
US 2023/0012484 A1  Jan. 19, 2023

(51) Int. Cl.
*H05K 5/02* (2006.01)
*H05K 5/00* (2006.01)

(52) U.S. Cl.
CPC ........... *H05K 5/0247* (2013.01); *H05K 5/006* (2013.01)

(58) Field of Classification Search
None
See application file for complete search history.

(56) References Cited

U.S. PATENT DOCUMENTS

| 6,686,712 | B2 * | 2/2004 | Numaguchi | H02P 1/54 |
| | | | | 318/113 |
| 8,987,593 | B2 * | 3/2015 | Korcz | H02G 3/086 |
| | | | | 362/147 |
| 9,419,381 | B2 * | 8/2016 | Shimizu | H01R 13/6581 |
| 9,648,766 | B1 * | 5/2017 | Eom | H05K 5/0247 |
| 9,661,773 | B2 * | 5/2017 | Mijac | H05K 5/0069 |
| 10,375,841 | B2 * | 8/2019 | Kaneko | B60T 8/34 |
| 11,038,333 | B2 * | 6/2021 | Schönfeld | H05K 5/03 |

(Continued)

FOREIGN PATENT DOCUMENTS

CN  217037729 U  *  7/2022
JP  S50-032785 Y1  9/1975

(Continued)

OTHER PUBLICATIONS

International Search Report of the International Searching Authority mailed Aug. 25, 2020 for the corresponding International application No. PCT/JP2020/011655 (and English translation).

*Primary Examiner* — Xanthia C Relford
(74) *Attorney, Agent, or Firm* — Posz Law Group, PLC

(57) ABSTRACT

A circuit box is to accommodate a circuit board that has a terminal stand for external wire connection and the circuit box includes a basal wall that has a mount face of which the circuit box is mounted, a side wall that is connected to a periphery of the basal wall and has a wire service entrance, a circuit-board support wall that is located apart from the basal wall and supports the circuit board, and a wire mount stand that has a wire support wall that extends from the wire service entrance in the side wall toward the circuit-board support wall and inclines away from the basal wall.

8 Claims, 8 Drawing Sheets

(56) References Cited

U.S. PATENT DOCUMENTS

| | | | |
|---|---|---|---|
| 11,229,135 B2* | 1/2022 | Hsieh | H05K 5/0247 |
| 11,357,122 B2* | 6/2022 | Hooijer | H05K 5/0247 |
| 11,528,817 B2* | 12/2022 | Galloway | H02J 9/06 |
| 11,602,065 B1* | 3/2023 | Hsiao | H05K 5/0247 |
| 2003/0085674 A1 | 5/2003 | Numaguchi et al. | |
| 2006/0176651 A1* | 8/2006 | Olzak | F16L 5/04 |
| | | | 361/679.31 |

FOREIGN PATENT DOCUMENTS

| | | |
|---|---|---|
| JP | H05-322289 A | 12/1993 |
| JP | H06-013768 A | 1/1994 |
| JP | H09-321444 A | 12/1997 |
| JP | 2003-153587 A | 5/2003 |

\* cited by examiner

CIRCUIT BOX

CROSS REFERENCE TO RELATED APPLICATION

This application is a U.S. national stage application of PCT/JP2020/011655 filed on Mar. 17, 2020, the contents of which are incorporated herein by reference.

TECHNICAL FIELD

The present disclosure relates to a circuit box for accommodating a circuit board that has a terminal stand for external wire connection.

BACKGROUND ART

Patent Literature 1 discloses a circuit box for accommodating a circuit board that has a terminal stand for external wire connection. The circuit box disclosed in Patent Literature 1 has a service entrance through which an external power cable is connected to the terminal stand.

CITATION LIST

Patent Literature

Patent Literature 1: Japanese Unexamined Patent Application Publication No. 9-321444

SUMMARY OF INVENTION

Technical Problem

The circuit box disclosed in Patent Literature 1 is to prevent dust from adhering to the terminal stand and the terminal stand is thus located at a position in which the terminal stand does not face the service entrance. A problem, however, exists in that the power cable, which is pulled in through the service entrance, has to be bent in the circuit box to be connected to the terminal stand and work efficiency is accordingly decreased.

The present disclosure is made to solve the above problem and has an object to provide a circuit box that has a terminal stand to which a connection cable such as a power cable is easily connected even in a case in which the terminal stand is located at a position in which the terminal stand does not face a service entrance.

Solution to Problem

A circuit box according to an embodiment of the present disclosure is to accommodate a circuit board that has a terminal stand for external wire connection and the circuit box includes a basal wall that has a mount face of which the circuit box is mounted, a side wall that is connected to a periphery of the basal wall and has a wire service entrance, a circuit-board support wall that is located apart from the basal wall and supports the circuit board, and a wire mount stand that has a wire support wall that extends from the wire service entrance in the side wall toward the circuit-board support wall and inclines away from the basal wall.

Advantageous Effects of Invention

A circuit box according to an embodiment of the present disclosure has a wire support wall that extends from a wire service entrance in a side wall toward a circuit-board support wall and inclines away from a basal wall and thus causes a tip of a wire pulled in through the wire service entrance in the side wall to be moved along the wire support wall and guides the tip of the wire to the terminal stand. The circuit box according to an embodiment of the present disclosure therefore has the terminal stand to which a wire that is not bent is allowed to be connected and thus facilitates work and reduces decrease in work efficiency.

DESCRIPTION OF EMBODIMENTS

Embodiment 1

Figure 1:
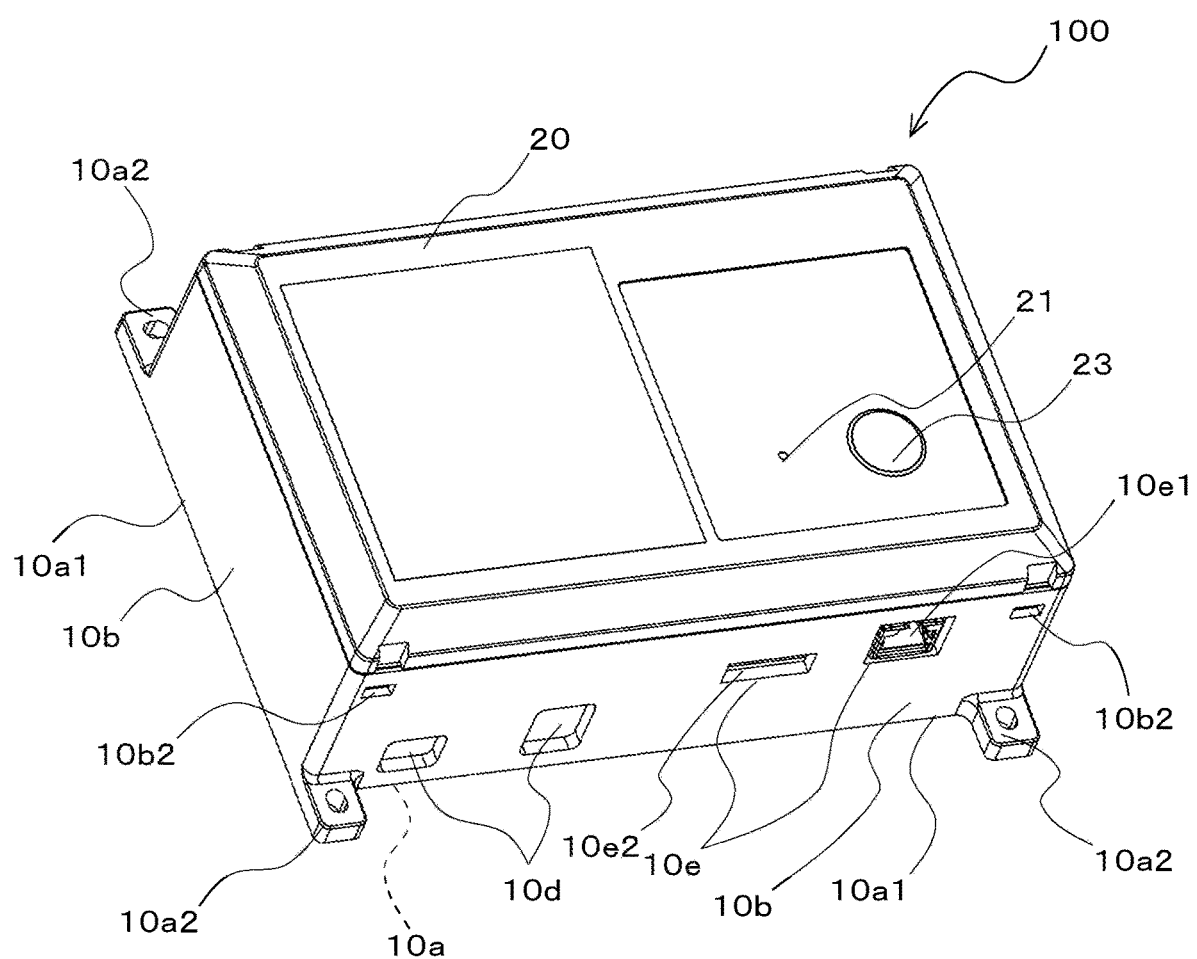
FIG. 1 is a perspective view that illustrates an example of an exterior of a circuit box according to Embodiment 1.
Figure 2:
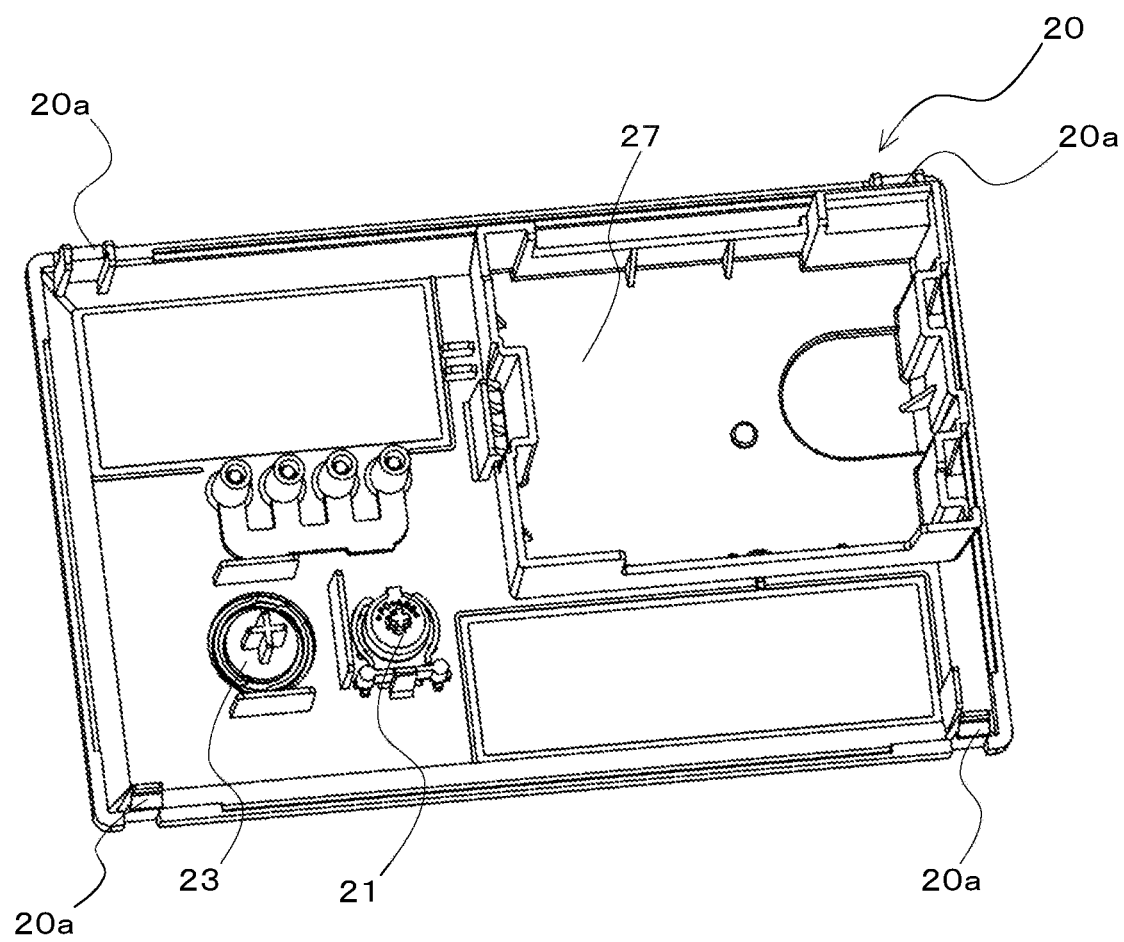
FIG. 2 is a perspective view that illustrates a configuration example of a back face of a lid of the circuit box according to Embodiment 1.

A circuit box 100 according to Embodiment 1 is described below with reference to FIG. 1. FIG. 1 is a perspective view that illustrates an example of an exterior of the circuit box 100 according to Embodiment 1. FIG. 2 is a perspective view that illustrates a configuration example of a back face of a lid 20 of the circuit box 100 according to Embodiment 1. Components of the circuit box 100 illustrated in the following drawings may differ from their actual components in dimensional relationship and shape. In addition, in the following drawings, the same reference signs are added to the same components or parts or components or parts that have the same function. In some cases, no reference signs may be added.

The circuit box 100 has a housing 10 and the lid 20, which form an exterior of the circuit box 100. The housing 10 is made of, for example, flame-retardant thermoplastic resin such as vinyl chloride. The lid 20 is made of, for example, flame-retardant thermoplastic resin such as vinyl chloride. The circuit box 100 may be used for, for example, a remote controller such as a relay device that remotely monitors an operational state of an air-conditioning apparatus.

The housing 10 has a basal wall 10a, which has a mount face of which the circuit box 100 is mounted, and a side wall 10b, which is connected to a fringe 10a1 of the basal wall 10a. The side wall 10b extends between the fringe 10a1 of the basal wall 10a and the lid 20. The side wall 10b has a portion that faces the lid 20 and is surrounded by an edge 10b1 of the side wall 10b and provides an aperture face 10c of the housing 10. The basal wall 10a and the side wall 10b of the housing 10 may be integrally formed with each other. Alternatively, the basal wall 10a and the side wall 10b may be formed as separate plates and connected to each other by, for example, flame-retardant adhesive.

A space surrounded by the basal wall 10a and the side wall 10b of the housing 10 is an internal space of the circuit box 100. The lid 20 is attached to the edge 10b1 of the side wall 10b of the housing 10 by fitting hooks 20a provided to the lid 20 into openings 10b2 provided to the side wall 10b of the housing 10. The internal space of the circuit box 100 is blocked by attaching the lid 20 to the edge 10b1 of the side wall 10b of the housing 10.

To the basal wall 10a of the housing 10, fixture portions 10a2 with which the circuit box 100 is mounted are provided. The circuit box 100 is mounted on, for example, a control board or a wall such that the circuit box 100 is fixed by fasteners such that screws and bolts through the fixture portions 10a2.

To the side wall 10b of the housing 10, one or more of wire service entrances 10d are provided. An external wire such as a power cable and a transmission cable is to be pulled in through the wire service entrance 10d. The wire service entrances 10d are each formed by, for example, perforating or cutting the side wall 10b of the housing 10. Although the following drawings, which include FIG. 1, provide no illustration, a wire-opening cap may be attached to each of the plurality of wire service entrances 10d. The wire-opening cap is made of, for example, flame-retardant thermoplastic resin such as flame-retardant ABS resin. Providing the wire-opening cap to the wire service entrance 10d reduces dust that enters the housing 10. With no use of the wire-opening cap, a gap between the external wire and the wire service entrance 10d in the side wall 10b may be sealed by a flame-retardant seal adhesive such as a flame-retardant silicone adhesive.

In addition, in accordance with an application of the circuit box 100, input-output ports 10e may be provided to the side wall 10b of the housing 10. The input-output ports 10e are each formed by, for example, perforating or cutting the side wall 10b of the housing 10. In a case in which, for example, the circuit box 100 is used for a relay device that remotely monitors an operational state of an air-conditioning apparatus, a LAN terminal 10e1 may be located at one of the input-output ports 10e and the relay device is thus connected to the internet. In addition, an external connection terminal 10e2 may be located at another one of the input-output ports 10e and a device such as a personal computer may be connected to a relay device to make settings of the relay device or maintain and inspect the relay device.

Examples of the external connection terminal 10e2 to be used include a USB terminal, an IEEE1394 terminal, and an eSATA terminal. In a case in which the circuit box 100 is used for the relay device described above, when the relay device is configured to wirelessly communicate, the relay device does not have to be provided with the LAN terminal 10e1 and the external connection terminal 10e2 and the input-output ports 10e thus may be omitted.

The lid 20 has a reset switch 21 and a power switch 23 on a front face of the lid 20. In a case in which, for example, the circuit box 100 is used for a relay device that remotely monitors an operational state of an air-conditioning apparatus, the reset switch 21 is used to initialize settings of the relay device and the power switch 23 is used to activate and deactivate the relay device. The reset switch 21 and the power switch 23 are formed such that the reset switch 21 and the power switch 23 are not in contact with a part, such as a terminal, through which electricity flows in an electric circuit of the relay device. The reset switch 21 and the power switch 23 are formed such that the reset switch 21 and the power switch 23 are not in contact with a part, such as a terminal, and safety of a user is thus ensured when the user presses the reset switch 21 and the power switch 23.

The lid 20 may be provided with a circuit cover 27 on a back face of the lid 20. Similarly to the lid 20, the circuit cover 27 is made of, for example, flame-retardant thermoplastic resin such as flame-retardant vinyl chloride. The circuit cover 27 may be integrally formed with the lid 20 through, for example, formation by use of a mold. Alternatively, the circuit cover 27 may be formed separately from the lid 20. In addition, the circuit cover 27 is formed separately from the lid 20, the circuit cover 27 may be attached to the lid 20 such that the circuit cover 27 is detachable. Alternatively, the circuit cover 27 may be fixed to the lid 20 by, for example, an adhesive. The circuit cover 27 covers an electric circuit, such as an inverter circuit, on which a semiconductor element, which radiates intense heat, is mounted. The lid 20 is provided with the circuit cover 27 on the back face of the lid 20 and influence on an outside of the circuit box 100 caused by, for example, intense heat of the electric circuit is thus reduced. In addition, the lid 20 is provided with the circuit cover 27 on the back face of the lid 20, dust and other foreign matter is thus prevented from attaching to the electric circuit, and the electric circuit is prevented from being short-circuited.

Figure 3:
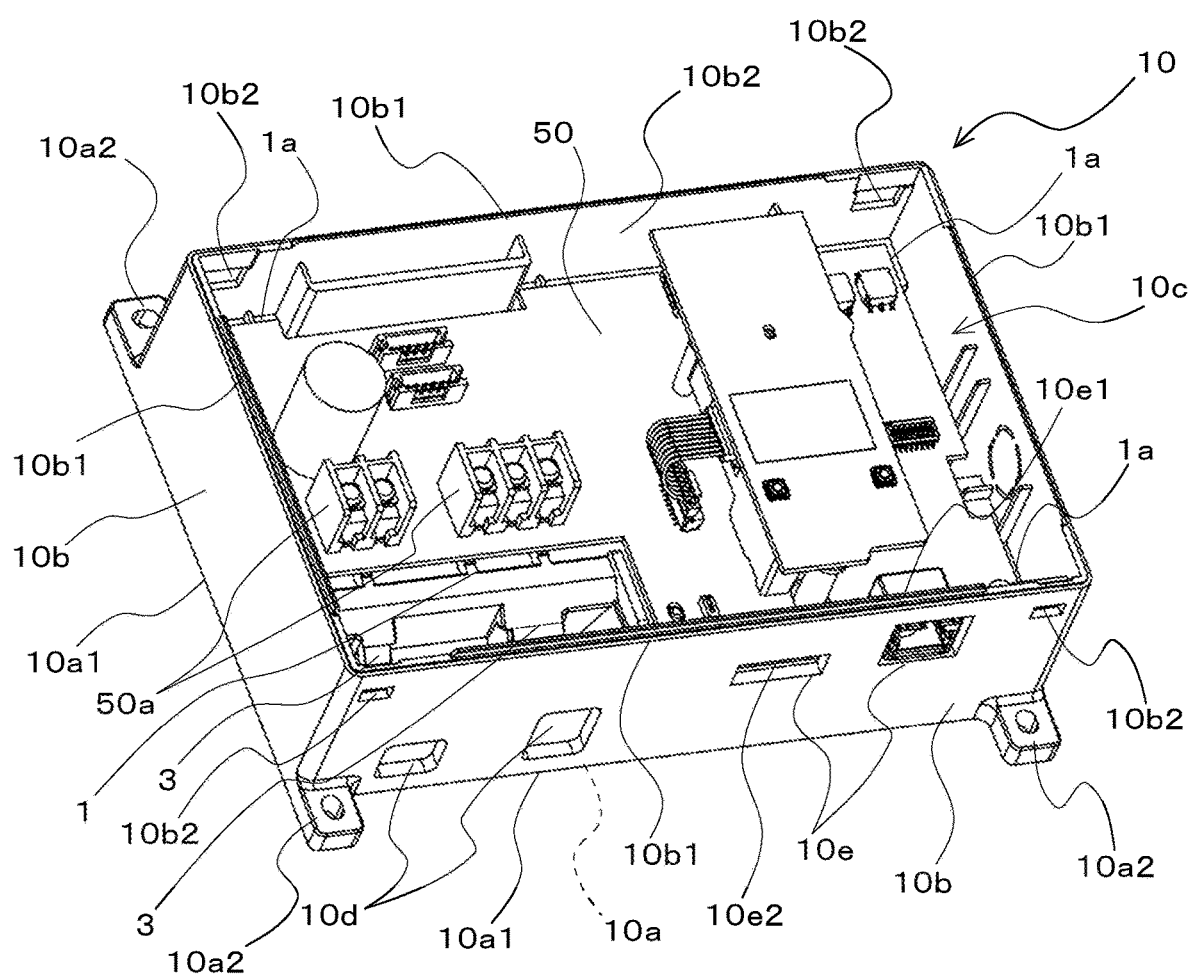
FIG. 3 is a perspective view that illustrates an internal configuration example of the circuit box according to Embodiment 1.
Figure 4:
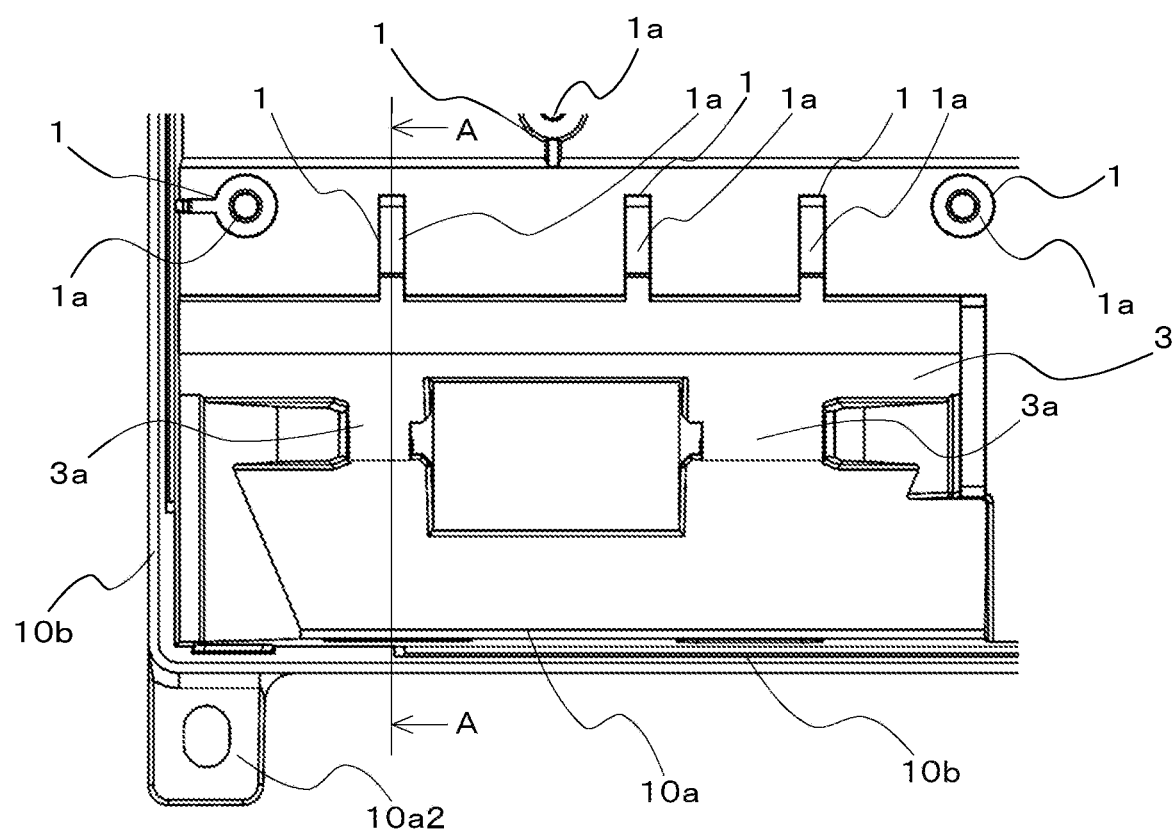
FIG. 4 is an enlarged front view that illustrates a wire mount stand in the circuit box according to Embodiment 1.
Figure 5:
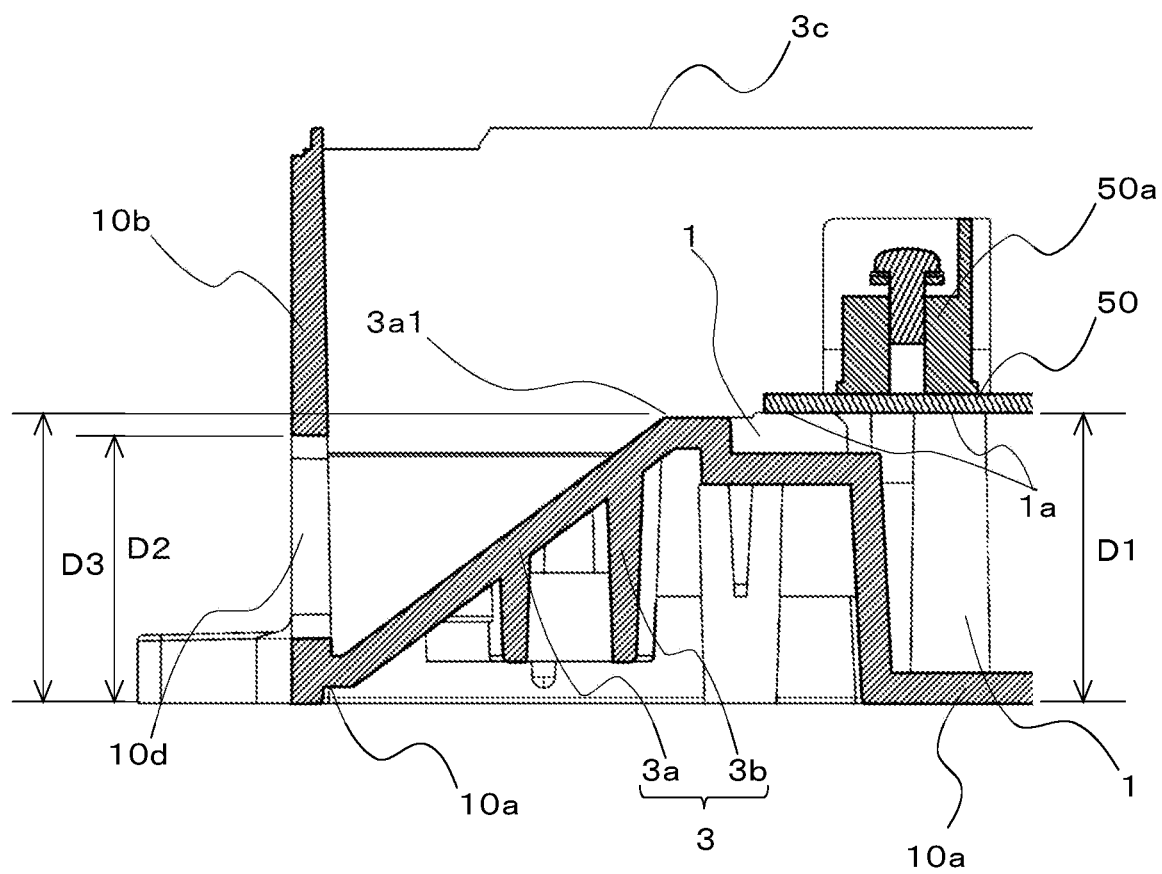
FIG. 5 is a sectional view that illustrates section A-A illustrated in FIG. 4.

Next, an internal configuration of the housing 10 is described below with reference to FIG. 3 to FIG. 5. FIG. 3 is a perspective view that illustrates an internal configuration example of the circuit box 100 according to Embodiment 1. FIG. 4 is an enlarged front view that illustrates a wire mount stand 3 in the circuit box 100 according to Embodiment 1. FIG. 5 is a sectional view that illustrates section A-A illustrated in FIG. 4. FIG. 4 illustrates an enlarged part of a circuit-board mount stand 1 and the wire mount stand 3 illustrated in a lower left of FIG. 3.

The housing 10 has the circuit-board mount stand 1 and the wire mount stand 3 inside the housing 10. On the circuit-board mount stand 1, a circuit board 50, which has terminal stands 50a for external wire connection, is mounted. On the circuit board 50, in addition to the terminal stands 50a, a plurality of semiconductor elements, such as an integrated circuit, are mounted. The circuit board 50 is located such that a placement face of the circuit board 50, on which the semiconductor elements are placed, faces toward the aperture face 10c of the housing 10. In a case in which, for example, the circuit box 100 is used for a relay device that remotely monitors an operational state of an air-conditioning apparatus, the circuit board 50 may have a control circuit, on which a microcomputer or other electronic device is mounted, mounted on the circuit board 50.

The circuit-board mount stand 1 has a circuit-board support wall 1a located away from the basal wall 10a, The circuit-board support wall 1a supports the circuit board 50 at a position at which the circuit-board support wall 1a does not interfere with a printed circuit and a conductor wire provided on the circuit board 50. The circuit-board mount stand 1 may be integrally formed with the wire mount stand 3 or the housing 10 through, for example, formation by use of a mold. Alternatively, the circuit-board mount stand 1 may be formed separately from the wire mount stand 3 or the housing 10.

As an example, the circuit-board mount stand 1 is formed as a support plate integrally formed with the wire mount stand 3 and the circuit-board support wall 1*a* is formed at an edge of the support plate that is closer to the aperture face 10*c* of the housing 10 than is the other edge of the support plate. As another example, the circuit-board mount stand 1 is formed as a cylindrical support leg, which extends from the basal wall 10*a* of the housing 10 toward an aperture 10*c* of the housing 10, and the circuit-board support wall 1*a* is formed at an edge of the support leg that is closer to the aperture face 10*c* of the housing 10 than is the other edge of the support leg. In a case in which the circuit-board mount stand 1 is formed as a cylindrical support leg, the circuit board 50 may be fixed by screws or other fasteners. Furthermore, as yet another example, the circuit-board mount stand 1 is formed as a support stand, which extends between the side wall 10*b* and the basal wall 10*a* of the housing 10 and is integrally formed with the side wall 10*b* and the basal wall 10*a* of the housing 10. In addition, the circuit-board support wall 1*a* is formed at an edge of the support stand that is closer to the aperture face 10*c* of the housing 10 than is the other edge of the support stand. In a case in which the circuit-board mount stand 1 is formed as a support stand, one or a plurality of circuit-board mount stands 1 may be formed along the fringe 10*a*1 of the basal wall 10*a*.

A width between the basal wall 10*a* and the circuit-board support wall 1*a* is defined as a first width D1. In addition, a width obtained by adding an aperture width of the wire service entrance 10*d* to a width between the basal wall 10*a* and the wire service entrance 10*d* is defined as a second width D2. As illustrated in FIG. 5, the circuit-board mount stand 1 is formed such that the first width D1 between the basal wall 10*a* and the circuit-board support wall 1*a* is greater than the second width D2. That is, in a case in which the circuit-board support wall 1*a* is viewed from the side wall 10*b* of the housing 10, a position of the circuit-board support wall 1*a* is further away from the basal wall 10*a* than is a position of the wire service entrance 10*d*. When the circuit-board support wall 1*a* is located as described above, dust that enters the housing 10 through the wire service entrance 10*d* is prevented from attaching to the circuit board 50 amounted on the circuit-board support wall 1*a* and short-circuit and other malfunction of the electric circuit caused by dust attached to the electric circuit is prevented.

In a case in which an inside of the housing 10 is viewed from the aperture face 10*c*, the wire mount stand 3 has a wire support wall 3*a* between the circuit-board support wall 1*a* and the side wall 10*b*, which has the wire service entrances 10*d*. The wire support wall 3*a* extends from the wire service entrance 10*d* in the side wall 10*b* toward the circuit-board support wall 1*a* and inclines away from the basal wall 10*a*. FIG. 5 illustrates, as an example of the wire support wall 3*a*, the wire support wall 3*a* that has a flat face. Alternatively, the wire support wall 3*a* may have, for example, a curved face as long as the wire support wall 3*a* extends from the wire service entrance 10*d* in the side wall 10*b* toward the circuit-board support wall 1*a* and inclines away from the basal wall 10*a*.

In addition, the wire mount stand 3 has a connection wall 3*b*, which extends between the wire support wall 3*a* and the basal wall 10*a*. The wire mount stand 3 may be integrally formed with the housing 10 through, for example, formation by use of a mold. Alternatively, the wire mount stand 3 may be formed separately from the wire mount stand 3 or the housing 10.

Next, how a connection cable, which is an external connection wire, is connected is described below. As the connection cable, a power cable, a transmission cable, such as a dedicated transmission line, or other cable that has a plurality of coated conductor wires that are further coated.

The connection cable pulled inside the housing 10 from an outside of the circuit box 100 through the wire service entrance 10*d* is pushed in and a tip of the connection cable thus collides with the wire support wall 3*a*. The wire support wall 3*a* extends from the wire service entrance 10*d* in the side wall 10*b* toward the circuit-board support wall 1*a* and inclines away from the basal wall 10*a* and the tip of the connection cable, which collides with the wire support wall 3*a*, is thus moved away from the basal wall 10*a*. That is, the tip of the connection cable is moved along an inclination of the wire support wall 3*a* toward the circuit-board support wall 1*a* and then reaches the circuit-board support wall 1*a*. The tip of the connection cable, which reaches the circuit-board support wall 1*a*, is connected to the terminal stand 50*a* of the circuit board 50 mounted on the circuit-board support wall 1*a* through the aperture face 10*c* of the housing 10. Connection work of the connection cable is thus completed.

As described above, the wire support wall 3*a* is made to extend from the wire service entrance 10*d* in the side wall 10*b* toward the circuit-board support wall 1*a* and to incline away from the basal wall 10*a* and the tip of the connection cable is thus made to reach the terminal stand 50*a* such that the wire is not bent. This configuration therefore eliminates need for manual work in which the connection cable is bent and guided to the terminal stand 50*a* and thus improves work efficiency at a time when the circuit box 100 is mounted.

In addition, the above configuration makes the tip of the connection cable to reach the terminal stand 50*a* by pushing in the connection cable and the circuit box 100 thus may be designed such that a gap between the wire service entrance 10*d* and the circuit-board support wall 1*a* is minimum possible. The above configuration therefore enables the circuit box 100 to be downsized.

Here, a maximum possible width between the basal wall 10*a* and the wire support wall 3*a* is defined as a third width D3. That is, the third width D3 is a width between a distal end 3*a*1 of the wire support wall 3*a*, which is closer to the circuit-board support wall 1*a* than is the other end of the wire support wall 3*a*, and the basal wall 10*a*.

The wire support wall 3*a* may be formed such that the third width D3, which is a width between the distal end 3*a*1 of the wire support wall 3*a*, which is closer to the circuit-board support wall 1*a* than is the other end of the wire support wall 3*a*, and the basal wall 10*a*, is narrower than or equal to the first width D1 between the basal wall 10*a* and the circuit-board support wall 1*a*. This configuration prevents the tip of the connection cable from being guided to a position across the terminal stand 50*a* and thus reduces decrease in work efficiency at a time when the circuit box 100 is mounted.

Embodiment 2

Figure 6:
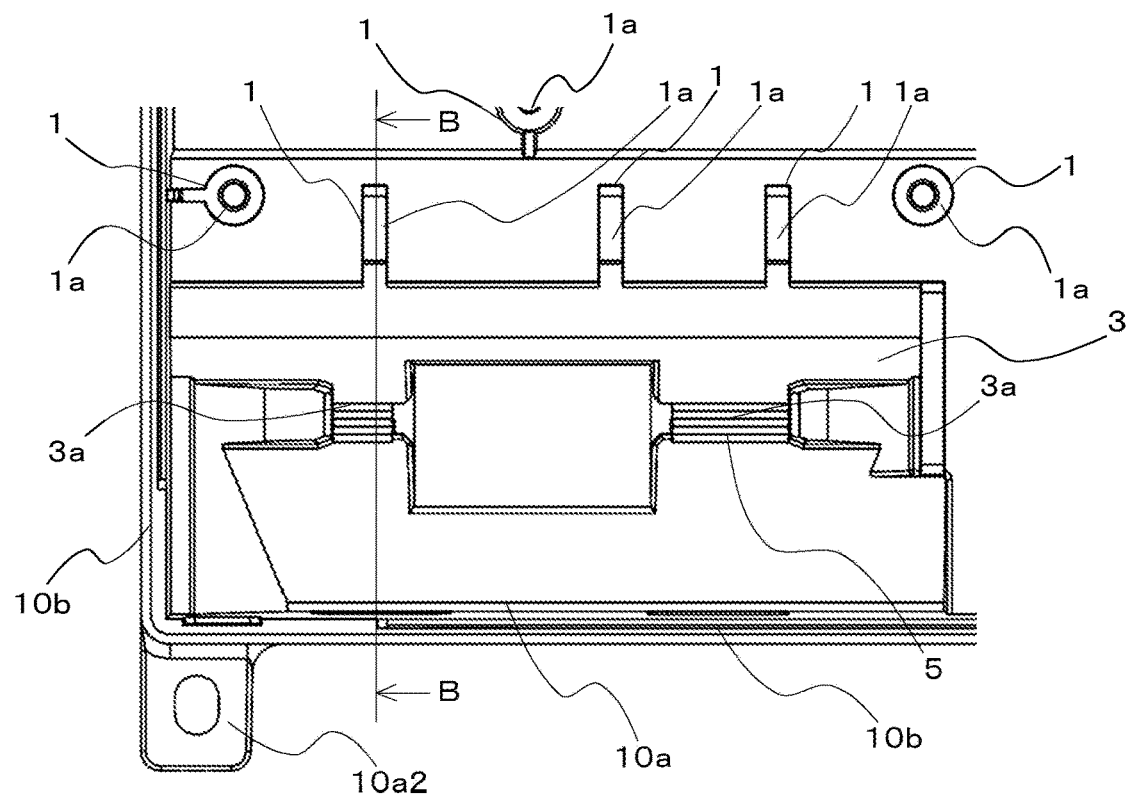
FIG. 6 is an enlarged front view that illustrates the wire mount stand in the circuit box according to Embodiment 2.
Figure 7:
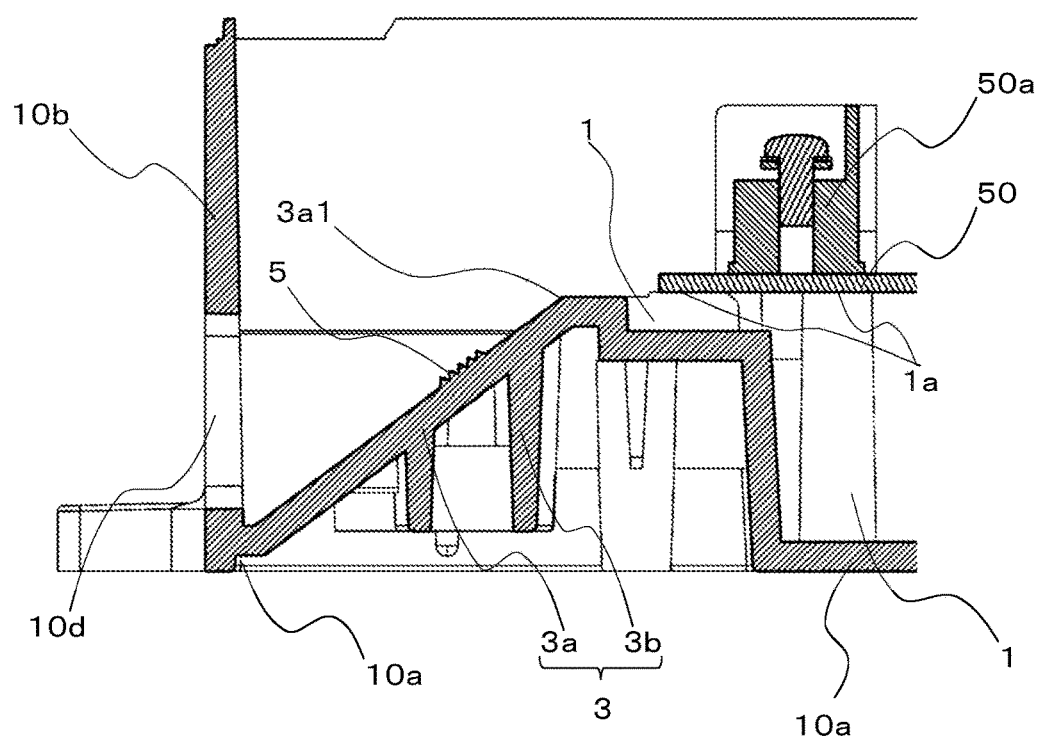
FIG. 7 is a sectional view that illustrates section B-B illustrated in FIG. 6.

The circuit box 100 according to Embodiment 2 is described below with reference to FIG. 6 and FIG. 7. FIG. 6 is an enlarged front view that illustrates the mount stand 3 in the circuit box 100 according to Embodiment 2. FIG. 7 is a sectional view that illustrates section B-B illustrated in FIG. 6.

The circuit box 100 according to Embodiment 2 has a plurality of ribs 5 provided on the wire support wall 3*a*. The plurality of ribs 5 each project from the wire support wall 3*a*. The plurality of ribs 5 may be integrally formed with the wire support wall 3*a* through, for example, formation by use of a mold. A configuration of the circuit box 100 according to Embodiment 2 other than part of the ribs 5 is the same as the configuration of Embodiment 1 described above and description of the same part of the configuration is thus omitted below.

The ribs 5 are each formed such that the rib 5 extends in a direction that intersects an inclination direction in which the wire support wall 3*a* inclines. For example, the ribs 5 are each formed such that the rib 5 extends in a direction perpendicular to the inclination direction in which the wire support wall 3*a* inclines. The ribs 5, which are each formed such that the rib 5 extends in a direction that intersects the inclination direction in which the wire support wall 3*a* inclines, serve function as slip resistance that prevents the connection cable from being moved in the inclination direction. The wire support wall 3*a* may have only one rib 5 or a plurality of ribs 5 provided on the wire support wall 3*a*.

In addition, the ribs 5 may be each formed such that the rib 5 has a triangular sectional shape in the inclination direction in which the wire support wall 3*a* inclines. When the rib 5 has a triangular sectional shape, tips of the ribs 5 are allowed to be pushed into a coat of the connection cable. By pushing the tips of the ribs 5 into the coat of the connection cable, even when external force is applied to the connection cable, the ribs 5 limit movement of the connection cable and the connection cable is thus prevented from coming off the corresponding terminal stand 50*a*. A triangular sectional shape of the ribs 5 therefore improves reliability of the circuit box 100.

Embodiment 3

Figure 8:
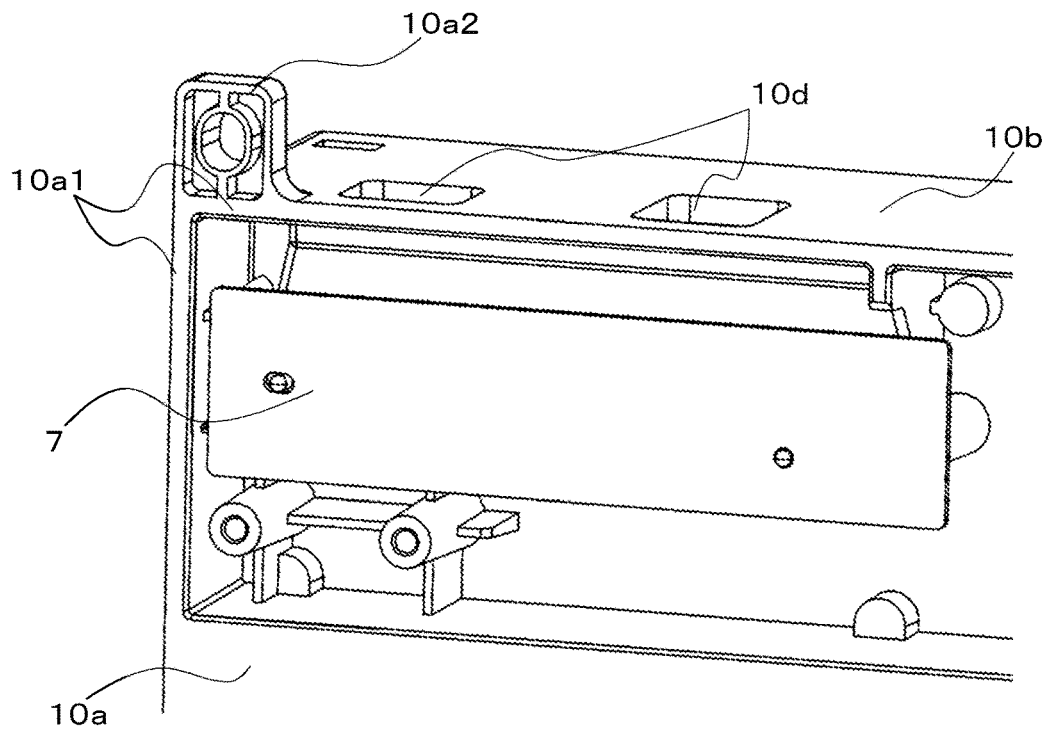
FIG. 8 is a perspective view that illustrates the circuit box according to Embodiment 3 in a case in which the circuit box is viewed from a basal wall.
Figure 9:
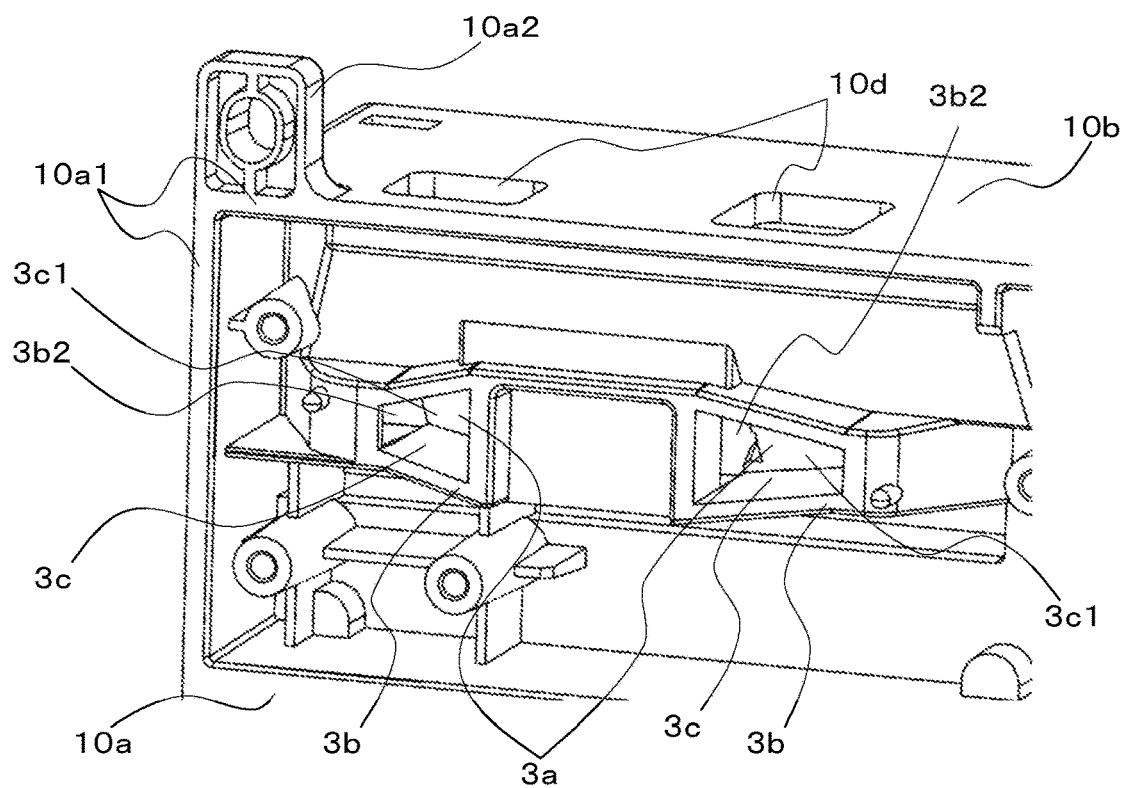
FIG. 9 is a perspective view that illustrates a case in which a blockage plate is detached from the circuit box illustrated in FIG. 8.
Figure 10:
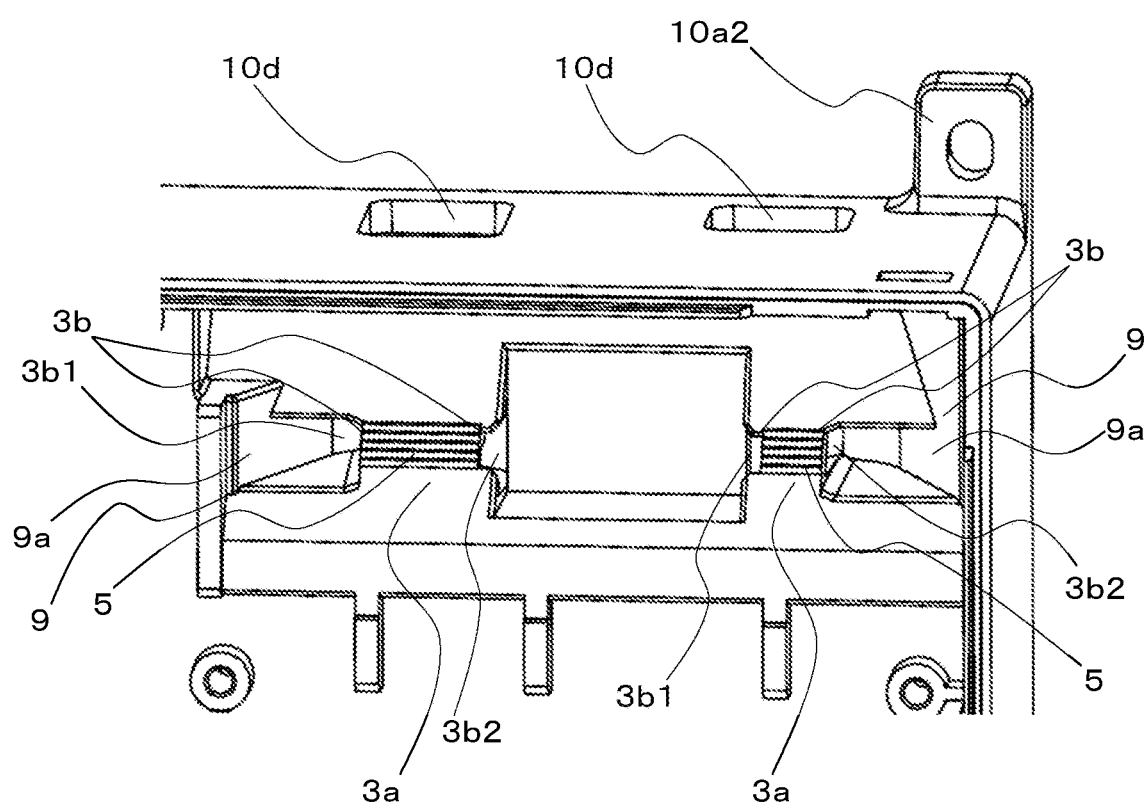
FIG. 10 is a perspective view that illustrates the circuit box illustrated in FIG. 9 in a case in which the circuit box is viewed from a wire support wall.

The circuit box 100 according to Embodiment 3 is described below with reference to FIG. 8 to FIG. 10. FIG. 8 is a perspective view that illustrates the circuit box 100 according to Embodiment 3 in a case in which the circuit box 100 is viewed from the basal wall 10*a*. FIG. 9 is a perspective view that illustrates a case in which a blockage plate 7 is detached from the circuit box 100 illustrated in FIG. 8. FIG. 10 is a perspective view that illustrates the circuit box 100 illustrated in FIG. 9 in a case in which the circuit box 100 is viewed from the wire support wall 3*a*. Only part of a configuration according to Embodiment 3 is described below that is different from the configurations of Embodiment 1 and Embodiment 2 described above.

The circuit box 100 according to Embodiment 3 has a first wire-binder guide hole 3*b*1 and a second wire-binder guide hole 3*b*2, which each extend through the connection wall 3*b* of the wire mount stand 3, provided in the connection wall 3*b*. The first wire-binder guide hole 3*b*1 and the second wire-binder guide hole 3*b*2 are allowed to communicate with each other through, for example, a hollow 3*c* defined by the wire support wall 3*a* and the connection wall 3*b*. When a passage that connects the first wire-binder guide hole 3*b*1 and the second wire-binder guide hole 3*b*2 to each other is defined as a communication passage 3*c*1, the communication passage 3*c*1 is formed as part of the hollow 3*c* and extends in a direction that intersects the inclination direction in which the wire support wall 3*a* inclines. In other words, the communication passage 3*c*1 is a passage that is formed along a face of the wire support wall 3*a* that is closer to the basal wall 10*a* than is the other face of the wire support wall 3*a* and the passage connects the first wire-binder guide hole 3*b*1 and the second wire-binder guide hole 3*b*2 to each other.

In Embodiment 3, providing the first wire-binder guide hole 3*b*1 and the second wire-binder guide hole 3*b*2 enables a wire binder to be attached to the wire mount stand 3 and the connection cable is thus allowed to be fixed to the wire support wall 3*a* by use of the wire binder. As the wire binder, a cable tie may be used that is, for example, commercially available and made of polyamide or polypropylene.

The hollow 3*c* is blocked by the blockage plate 7, which is made of a metal plate such as stainless steel, and the blockage plate 7 is located between the hollow 3*c* and the basal wall 10*a* of the housing 10. Blocking the hollow 3*c* by the blockage plate 7 prevents dust from entering the circuit box 100. In addition, blocking the hollow 3*c* by the blockage plate 7 prevents a tip of the wire binder inserted into the hollow 3*c* through either one of the first wire-binder guide hole 3*b*1 and the second wire-binder guide hole 3*b*2 from traveling out from the basal wall 10*a* of the housing 10.

In addition, the circuit box 100 according to Embodiment 3 may have a wire-binder guide wall 9. The wire-binder guide wall 9 may be integrally formed with the housing 10 through, for example, formation by use of a mold. The wire-binder guide wall 9 may be located such that the wire-binder guide wall 9 faces one or both of the first wire-binder guide hole 3*b*1 and the second wire-binder guide hole 3*b*2 in the connection wall 3*b*. In addition, the wire-binder guide wall 9 may be formed such that the wire-binder guide wall 9 has a guide face 9*a*, which inclines further away from the connection wall 3*b* as the guide face 9*a* is further away from the basal wall 10*a* of the housing 10.

Providing the wire-binder guide wall 9 to the circuit box 100 enables the tip of the wire binder, which extends through the connection wall 3*b*, to be guided in a direction in which a worker intends to move the tip of the wire binder. In particular, providing the guide face 9*a*, which inclines further away from the connection wall 3*b* as the guide face 9*a* is further away from the basal wall 10*a* of the housing 10, to the wire-binder guide wall 9 enables the tip of the wire binder, which extends through the connection wall 3*b*, to be guided in a direction in which the tip of the wire binder is away from the basal wall 10*a* of the housing 10. The tip of the wire binder, which extends through the connection wall 3*b*, is therefore guided toward the aperture face 10*c* of the housing 10 and work efficiency is thus improved at a time when the wire binder is bound. In addition, need for a space in which the wire binder is bound is eliminated and the circuit box 100 is accordingly allowed to be designed to be downsized.

Other Embodiments

An example is described above in which the circuit box 100 according to the present disclosure is used for a remote controller such as a relay device that remotely monitors an operational state of an air-conditioning apparatus. The circuit box 100 according to the present disclosure, however, is not limited to be used for such a remote control. The circuit box 100 according to the present disclosure is also usable as a circuit box 100 for an electric apparatus other than an air-conditioning apparatus.

In addition, it is possible to combine Embodiments described above with each other.

REFERENCE SIGNS LIST

1: circuit-board mount stand, 1*a*: circuit-board support wall, 3: wire mount stand, 3*a*: wire support wall, 3*a*1: distal end, 3*b*: connection wall, 3*b*1: first wire-binder guide hole, 3*b*2: second wire-binder guide hole, 3*c*: hollow, 3*c*1: communication passage, 5: rib, 7: blockage plate, 9: wire-binder guide wall, 9*a*: guide face, 10: housing, 10*a*: basal wall, 10*a*1 fringe, 10*a*2: fixture portion, 10*b*: side wall, 10*b*1: edge, 10*b*2: opening, 10*c*: aperture face, 10*d*: wire service entrance, 10*e*: input-output port, 10*e*1: LAN terminal, 10*e*2: external connection terminal, 20: lid, 20*a*: hook, 21: reset switch, 23: power switch, 27: circuit cover, 50: circuit board, 50*a*: terminal stand, 100: circuit box

The invention claimed is:

1. A circuit box for accommodating a circuit board having a terminal stand for connection of an external wire, the circuit box comprising:
    a basal wall that has a mount face of which the circuit box is mounted;
    a side wall that is connected to a periphery of the basal wall and has a wire service entrance;
    a circuit-board support wall that is located apart from the basal wall and supports the circuit board; and
    a wire mount stand that has a wire support wall that extends from the wire service entrance in the side wall toward the circuit-board support wall and inclines away from the basal wall,
    the wire support wall having slip resistance for the external wire.

2. The circuit box of claim 1, wherein a first width between the basal wall and the circuit-board support wall is greater than a second width that is obtained by adding an aperture width of the wire service entrance to a width of the side wall between the basal wall and the wire service entrance.

3. The circuit box of claim 1, wherein a third width that is maximum between the basal wall and the wire mount stand is narrower than or equal to a first width between the basal wall and the circuit-board support wall.

4. The circuit box of claim 1, wherein the slip resistance for the external wire comprises a rib that projects from the wire support wall and extends in a direction that intersects an inclination direction in which the wire support wall inclines.

5. The circuit box of claim 4, the rib has a triangular cross-sectional shape in the inclination direction in which the wire support wall inclines.

6. The circuit box of claim 1, wherein the wire mount stand has a connection wall that extends between the wire support wall and the basal wall,
    the connection wall has a first wire-binder guide hole that extends through the connection wall and a second wire-binder guide hole that communicates with the first wire-binder guide hole and extends through the connection wall, and
    the first wire-binder guide hole and the second wire-binder guide hole communicate with each other through a communication passage that extends in a direction that intersects an inclination direction in which the wire support wall inclines.

7. The circuit box of claim 6, further comprising
    a wire-binder guide wall that faces one or both of the first wire-binder guide hole and the second wire-binder guide hole in the connection wall, wherein
    the wire-binder guide wall has a guide face that inclines further away from the connection wall as the guide face is further away from the basal wall.

8. The circuit box of claim 1, wherein the slip resistance for the external wire projects from the wire support wall.

* * * * *